United States Patent [19]

Bahl et al.

[11] 4,190,489
[45] Feb. 26, 1980

[54] GOLD ETCHANT COMPOSITION AND METHOD

[75] Inventors: Surinder K. Bahl; Gale L. Leach, both of Dayton, Ohio

[73] Assignee: The Mead Corporation, Dayton, Ohio

[21] Appl. No.: 944,631

[22] Filed: Sep. 21, 1978

[51] Int. Cl.² ............................................. C23F 1/00
[52] U.S. Cl. ................................. 156/664; 156/656; 252/79.1
[58] Field of Search ............ 252/79.1, 79.3, 79.5; 156/664, 654, 656; 96/36.2, 38.4; 204/129.1, 129.75, 129.8

[56] References Cited

U.S. PATENT DOCUMENTS

| | | | |
|---|---|---|---|
| 2,982,626 | 5/1961 | Kainins | 252/79.1 UX |
| 3,245,891 | 4/1966 | Gary | 204/129.1 X |
| 3,442,810 | 5/1969 | Elbreder | 252/79.4 |
| 3,629,023 | 12/1971 | Strehlow | 252/79.1 X |
| 3,778,252 | 12/1973 | Wilson | 75/101 R |
| 3,816,317 | 6/1974 | MacArthur et al. | 252/79.5 |

*Primary Examiner*—William A. Powell
*Attorney, Agent, or Firm*—Biebel, French & Nauman

[57] ABSTRACT

A composition and method for etching gold, particularly gold layers on ceramic substrates, in which the gold is contacted at room temperature by an aqueous solution of alkali metal bromide and bromine. The composition is relatively safe and easy to handle and rapidly etches gold.

8 Claims, No Drawings

GOLD ETCHANT COMPOSITION AND METHOD

BACKGROUND OF THE INVENTION

Use of gold films as conductors in integrated and thin film circuitry is widespread in the electronics industry. In order to form intricate circuitry patterns, these gold films must be able to be accurately and rapidly etched away with no adverse effect on nearby areas. In the past, standard practice has been to etch gold films with hot aqua regia, basic ferricyanide solutions, or potassium iodide-iodine solutions. Use of such etchant solutions has not been entirely satisfactory, however, due to problems in handling such solutions.

For example, aqua regia is a very strong acid which requires careful handling. Likewise, MacArthur et al., U.S. Pat. No. 3,816,317, which uses a strongly basic ferricyanide solution, warn of precautions which must be taken to avoid emission of toxic cyanide gas during the etching process. Iodine solutions are opaque and require periodic rinsing to determine the etching progress.

Accordingly, the need exists in the art for a rapid and yet relatively safe and easy to handle etchant for gold films.

SUMMARY OF THE INVENTION

An aqueous bromide-bromine solution containing a mole ratio of about 1 to 2 moles of alkali metal bromide to about 1 mole of bromine has been found to be a rapid and accurate etchant for gold films which is relatively safe and easy to handle. Gold films up to 1000 Å thick can be etched away completely by contacting them with the etchant of this invention at room temperature for a period of only a fraction of a second to a few seconds. Since the bromide-bromine solution is a transparent red color, the progress of gold etching can be easily assessed. Thicker films of gold (e.g., those greater than 2 microns thick) will also be completely etched away in a matter of seconds. The rate of etching may be increased by heating the bromide-bromine solution, or changing the concentration of bromide and bromine in the solution, or both. The etchant of the present invention is also compatible (i.e., will not etch) with standard photoresist compositions used in the art.

DESCRIPTION OF THE PREFERRED EMBODIMENTS

Gold etchant solutions of the present invention are prepared by mixing 37–75 grams of potassium bromide (KBr) and 25 grams of bromine (Br) in 200 ml of water. It has been found that these ratios and concentrations of bromide to bromine produces rapid etching of gold layers at room temperature, however, both the concentration and ratio of bromide to bromine may be varied still further. Changes in the concentration of the bromide-bromine solution affect the rate that it etches gold. Such a change in etch rate may be desirable when thicker layers of gold (e.g., greater than 2 microns) must be etched where an increase in etch rate will be helpful. Raising the temperature of the solution is found to also increase the etch rate. Although bromide to bromine mole ratios of from 1:1 to 2:1 are preferred, these ratios are not critical, and the relative ratio of bromide to bromine may vary widely. Any source of bromide ions such as any alkali metal bromide is suitable.

A further advantage of the bromide-bromine etchant of the present invention is that it is compatible (i.e., will not etch) with commercially available photoresist materials such a RISTON resist, the trademark for a polymeric photoresist composition available from Kodak Corp. Since photoresist materials are widely used in the art as masks to protect metal layers during etching procedures, it is important for an etchant composition to be compatible with such materials as the bromide-bromine etchant of the present invention is.

EXAMPLE I

A ceramic substrate was plated with gold to a thickness of 1000 Å. A bromide-bromine etchant made by mixing 75 grams of potassium bromide and 25 grams of bromine in 100 ml. of water was applied to a portion of the gold layer and then rinsed off with distilled water after 2 to 3 seconds. The gold layer was completely etched away in the area contacted by the etchant solution. For 2500 Å thick gold film, this solution took 30–35 seconds to etch.

EXAMPLE II 10 ml. of the bromide solution of Example I was diluted with 10 ml. of distilled water. This diluted solution was applied to a 2500 Å thick gold film and was rinsed off after 10–15 seconds. The gold film was completely etched away in the area where etchant was applied. For this thicker film, the etching rate of the diluted solution was faster than the solution of Example I.

EXAMPLE III 10 ml. of the bromide solution of Example I was diluted with 20 ml. of distilled water. It took 25–30 seconds to etch a 2500 Å thick gold film.

EXAMPLE IV 10 ml. of the bromide solution of EXAMPLE I was mixed with 30 ml. of distilled water. It took 40–45 seconds to etch 2500 Å thick film.

As is clear, the etching rates can be considerably varied by diluting an aqueous solution containing a 2:1 mole ratio of KBr to bromine.

EXAMPLE V

Bromide-bromine etchant was also made by mixing 12 grams of KBr and 8 grams of bromine in 100 ml. of distilled water. This etchant was applied to a portion of 2000 Å thick gold film deposited onto a glass substrate. After 15 seconds the area where etchant was applied was rinsed off with distilled water; the gold layer was completely etched away in this area.

EXAMPLE VI 10 ml. of the bromide-bromine solution of Example V was diluted with 10 ml. of distilled water. This solution was applied to 2000 Å thick gold film deposited onto glass substrate and was rinsed off with distilled water after 10 seconds. The gold film was completely etched away where the etchant was applied.

EXAMPLE VII 10 ml. of the solution of Example V was mixed with 20 ml. of distilled water. It took 20–25 seconds to completely etch 2000 Å of gold film.

As is clear from examples V–VII, the etching rates can be varied considerably again by simply diluting the aqueous bromide-bromine solution containing a mole ratio of 1 mole of KBr to 1 mole of bromine.

EXAMPLE VIII

To illustrate the suitability of other alkali metal bromides as a source of bromide ions in the practice of this invention, 18 grams of sodium bromide (NaBr) and 2 grams of bromine were mixed with 100 ml. of distilled water. This etchant was applied to a portion of a 2000 Å thick gold film deposited onto a glass substrate. After about 30-40 seconds, the etchant was rinsed off with distilled water. The gold layer was completely etched away in this area.

While the compositions and methods described herein constitute preferred embodiments of the invention, it is to be understood that the invention is not limited to these precise compositions or methods, and that changes may be made in either without departing from the scope of the invention, which is defined in the appended claims.

What is claimed is:

1. A gold etchant composition consisting essentially of an aqueous solution of from 3.3% to 37.5% alkali metal bromide, 2.2% to 12.5% bromine, and balance water, all percentages by weight, said etchant being capable of etching a gold layer at the rate of at least 50 Å/sec.

2. The composition of claim 1 where the mole ratio of alkali metal bromide to bromine is from 1:1 to 2:1.

3. The composition of claim 2 where the alkali metal bromide is potassium bromide.

4. A method of etching a gold layer from a substrate material comprising the steps of contacting said gold layer with an aqueous solution comprising a mixture of an alkali metal bromide and bromine for a time sufficient to etch away said gold layer.

5. The method of claim 4 where the mole ratio of alkali metal bromide to bromine is from 1:1 to 2:1.

6. The method of claim 5 where the alkali metal bromide is potassium bromide.

7. The method of claim 6 where the contacting step occurs at room temperature.

8. The method of claim 7 where the gold layer is on a ceramic substrate and the time of contact is 2 to 40 seconds depending on the dilution of the bromide-bromine solution and thickness of the gold film.

* * * * *